United States Patent [19]

Kanda et al.

[11] Patent Number: 5,089,104
[45] Date of Patent: Feb. 18, 1992

[54] METHOD AND APPARATUS FOR FORMING A MULTIPLE-ELEMENT THIN FILM BASED ON ION BEAM SPUTTERING

[75] Inventors: Naoya Kanda, Yokosuka; Yasushi Ishikawa, Hitachi; Kunio Matsumoto; Hiroshi Asao, both of Yokohama, all of Japan

[73] Assignee: Hitachi, Ltd., Tokyo, Japan

[21] Appl. No.: 620,611

[22] Filed: Dec. 3, 1990

[30] Foreign Application Priority Data

Dec. 4, 1989 [JP] Japan .................. 1-313370

[51] Int. Cl.$^5$ ............................. C23C 14/34
[52] U.S. Cl. ..................... 204/192.11; 204/192.13; 204/298.04; 204/298.03
[58] Field of Search .......... 204/192.11, 192.13, 204/192.12, 298.03, 298.04

[56] References Cited

U.S. PATENT DOCUMENTS

| | | | |
|---|---|---|---|
| 4,407,709 | 10/1983 | Enjouji et al. | 204/192.13 |
| 4,637,869 | 1/1987 | Glocker et al. | 204/192.11 |
| 4,673,475 | 6/1987 | Windischmann | 204/192.11 |
| 4,793,908 | 12/1988 | Scott et al. | 204/192.11 X |
| 4,894,132 | 1/1990 | Tanaka | 204/192.13 |
| 4,895,631 | 1/1990 | Wirz et al. | 204/192.13 |

FOREIGN PATENT DOCUMENTS 3625700  2/1988  Fed. Rep. of Germany .............. 204/298.04

Primary Examiner—Nam X. Nguyen
Attorney, Agent, or Firm—Antonelli, Terry, Stout & Kraus

[57] ABSTRACT

Ion beams drawn out of a plurality of ion beam sources or neutralized beams derived therefrom are projected to a plurality of targets, and sputtered particles discharged from the targets are directed to a substrate. The composition of sputtered particles is measured in the vicinity to the substrate. The measured coomposition is compared with the predetermined reference value and the composition of sputtered particles is controlled based on the result of measurement. sputtered particles having a controlled composition distribution are deposited on the substrate thereby to form a multiple-element thin film.

9 Claims, 3 Drawing Sheets

METHOD AND APPARATUS FOR FORMING A MULTIPLE-ELEMENT THIN FILM BASED ON ION BEAM SPUTTERING

BACKGROUND OF THE INVENTION

The present invention relates to a method and apparatus for forming a multiple-element thin film based on ion beam sputtering.

A variety of techniques have been proposed in connection with the method and apparatus for forming multiple-element thin films. They base the principle of evaporation on the utilization of the usual sputtering phenomenon, evaporation by electron beam heating, sputtering with a single ion beam source or neutral beam source and one or more targets or with a plurality of targets and ion beam sources, for example.

In any film forming method and apparatus, the composition control is determined from the relation between the quantity and condition of film formation on a trial-and-error basis, and therefore if the surface condition or the like of the target changes or if the atmosphere of film formation changes when the experiment is put into practice, the sputtering rate and the rate of deposition on the substrate will vary, resulting in a deviated film composition. This problem is attributable to the absence of in-situ monitoring, i.e., on-the-spot observation, of the composition during the film formation, and the absence of a facility for conditioning the film formation based on the result of monitoring. Techniques related to this affair are described in JP-A-63-53265 and JP-A-63-241822, for example.

Among the above-mentioned conventional techniques, evaporation of usual D.C. sputtering phenomenon involves such a problem that an insulator target made of oxide or the like cannot be sputtered. Application of high-frequency sputtering which can deal with insulator targets encounters the difficulty in controlling the sputtering speed of film formation independently because of the electrical linkage of voltages applied to the target electrodes, leaving a problem of inaccurate composition control. The atmosphere of film formation is variable only in the domain where plasma for sputtering the target exists stably, and it is limited in the adjustment range of composition. On this account, in forming a compound thin film including liquid or gaseous elements at the room temperature, these elements volatiles into the atmosphere, and therefore the range of composition control for these elements is limited for methods based on reactive sputtering. The above-mentioned sputtering techniques necessitate the creation of plasma on the target, which causes high-energy ions or electrons to be injected into the created film, resulting possibly in a decayed film. The emergence of discharging or plasma luminescence in the proximity of the substrate disables the in-situ monitoring for the composition of sputtered particles through the method which does not render electrical disturbance to the interior of the film formation chamber, and therefore indirect measurement of the particle composition based on the measurement of the film thickness is required.

In the case of evaporation by electron beam heating or the like, the range of evaporation control for each constituent is small and the quantity of evaporation varies slowly in response to the heating power, leaving a problem in inaccurate composition control even with the provision of an in-situ composition monitor. Reactive deposition of oxide is prone to encounter the oxidation inside the crucible and instability of the evaporation area in the crucible, leaving a problem in composition control.

An example of film formation which is high in controllability of composition and satisfactory in crystal formation is the moleculer beam epitaxial method. However, it encounters the difficulty in gas introduction and the like due to the restriction of film material by the fusion point and vapor pressure and the environment of high vacuum, leaving a problem of difficult thin film formation for oxide and nitride.

SUMMARY OF THE INVENTION

An object of the present invention is to provide a method of thin film formation in accurate composition.

Another object of the present invention is to provide a thin film forming apparatus capable of forming a thin film of accurate composition.

This film forming method based on sputtering is capable of creating a high-performance thin film of both metallic and insulation materials at high adhesion easily and at high repeatability. Particularly, the ion beam sputtering method, which is distinct from the usual sputtering method in the formation a film in high vacuum on a substrate separated from plasma, has many superior features, such as that the film is insusceptible of damage from high-energy particles, film formation parameters can be controlled independently, and inclusion of impurity in the film can be reduced. In the field of high-temperature superconductive films, semiconductor thin film circuits, magnetic recording films, etc., there are demands of technical development for the creation of alloys and compound thin films with precisely-controlled composition of multiple elements.

The present invention is intended to enhance the accuracy of composition of a compound thin film which is formed of multiple elements, while exerting the advantages of the ion beam sputtering method and apparatus.

In the case of sputtering based on one ion beam source or neutral beam source and one or more targets, it is not possible to vary the sputtering rate continuously for each constituent element, and therefore it is not possible to control the composition precisely or vary the proportion of constituents in the thickness direction (continuous slope of concentration or periodical change in composition). To cope with this matter, there is a facility having a plurality of targets and ion beam sources, but it is not operative to monitor the sputtered particle composition and control the ion beam sources or neutral beam sources during the film formation, and therefore because of changes in the film forming conditions from those at the experiment due to changes in the shape and surface condition of dissipating targets and changes in the film forming atmosphere, which requires another trial-and-error experiment at each change, making accurate composition control difficult and very inefficient.

The present invention is intended to overcome the foregoing problems, and its first object is to provide a method of forming a multiple-element thin film with a stable composition control property, in which each constituent can be controlled independently, the composition ratio of sputtered particles is monitored directly during the film formation, the ion beam sources or neutral beam sources are controlled dynamically based on the result of monitoring, and the film forming atmosphere can be treated as an independent condition, and its second object is to provide the apparatus which implements the above-mentioned method.

The inventive method and apparatus are capable of controlling the concentration of each constituent accurately, and they are applicable favorably to the film formation of multiple-element compounds which need composition control, e.g., multiple-element oxides, multiple-element nitrides, multiple-element metallic compounds and alloys, gradient compounds, gradient alloys, and artificial super lattices.

The above objective is namely to accomplish a film forming method and apparatus based on the simultaneous multiple-element ion beam sputtering, in which ion beam sources or neutral beam sources, at least equal in number to targets, are disposed and sputtered particles discharged from each target are deposited evenly at a controlled concentration on a substrate. During the film formation, the composition ratio of sputtered particles which pass by the substrate surface is measured by using the atomic absorption method, the measured data is rendered the computation process, and the acceleration voltage and the ion beam current density of each ion beam source are adjusted so as to achieve a proper composition ratio of sputtered particles thereby to control the concentration of sputtered particles.

Means of accomplishing the above-mentioned objective of the present invention will be described more specifically in detail. The above-mentioned first object is accomplished as follows.

(1) The inventive film formation method based on ion beam sputtering operates to project ion beams drawn out of a plurality of ion beam sources or neutralized beams thereof on to a plurality of targets for sputtering provided in correspondence to the ion beam sources, so that sputtered particles discharged from the targets are deposited on a substrate thereby to form a multiple-element thin film. The composition ratio of sputtered particles which pass by the substrate surface is measured by using the atomic absorption method, the measured composition ratio is compared with the predetermined reference composition ratio thereby to detect the deviation, a computation process is conducted based on the detected result to produce output data so that the prescribed composition ratio of sputtered particles is achieved, and the power sources of the ion beam sources are controlled thereby to adjust their acceleration voltages and ion current densities. The composition ratio of sputtered particles which are deposited on the substrate is monitored directly during the film formation.

(2) More specifically, the multiple-element thin film forming method based on ion beam sputtering described in the above item (1) is designed such that the targets are made of at least one of metal, metallic oxide and metallic nitride, at least one of the ion beams or neutralized ion beams is formed of at least one type of beam of oxygen or nitrogen as an assistant ion beam source, and a thin film of composite metallic compound made of at least one of composite metallic oxide and composite metallic nitride is formed on the substrate.

(3) Specifically, the multiple-element thin film forming method based on ion beam sputtering described in the above item (1) is designed such that the targets are made of at least one of single metal and alloy, the ion beam sources are of rare gaseous element, and a thin film of at least one of alloy and metallic compound is formed on the substrate.

(4) Specifically, the multiple-element thin film forming method based on ion beam sputtering described in the above item (1) is designed such that the targets are made of at least one of metal, metallic oxide and metallic nitride, at least one of the ion beams or neutralized ion beams is formed of at least one type of beam of oxygen or nitrogen as an assistant ion beam source, and a multi-layer film wiring structure made of metallic compound thin film and metallic thin film formed of at least one of metallic oxide and metallic nitride is formed on the substrate.

The second object is accomplished as follows.

(5) The inventive multiple-element ion beam sputtering thin film forming apparatus is designed to comprise a plurality of ion beam sources or neutral beam sources which can be controlled independently, a plurality of targets as evaporation sources of thin film constituents provided in correspondence to the beam sources, means of projecting the beams to the targets thereby to deposit sputtered particles discharged from the targets on the substrate, means of measuring the concentration of sputtered particles, which are discharged from the targets and directed to the substrate, based on the atomic absorption method in the vicinity to the substrate, means of comparing the measurement result with the predetermined reference composition ratio of sputtered particles thereby to detect the deviation and implementing a computation process based on the detection result to produce output data so that the prescribed composition ratio of sputtered particles is achieved, and means of controlling the power supplies to the ion beam sources or neutral beam sources based on the result of computation to adjust the acceleration voltage and current density of the beams thereby to control the composition ratio of the sputtered particles. The composition ratio of sputtered particles which are deposited on the substrate is monitored directly during the film formation.

(6) Specifically, the inventive multiple-element ion beam sputtering thin film forming apparatus described in the above item (5) is designed to comprise, in addition to the ion beam sources which project the beams to the targets, an assistant ion beam source which projects a beam directly on to the substrate.

The ion beam sources use such rare gas as argon, or even oxygen or nitrogen depending on the composition of film. The beams of this type are charged electrostatically in general, and therefore in the case of targets made of insulator, e.g., oxide, the ion beams may be neutralized through a neutralizing filament before the beams are projected to the targets thereby to prevent the targets from being charged, when necessary. In case a constituent of the intended thin film composition includes an element which is gaseous or liquid at the room temperature, e.g., oxygen and water, it is also possible to feed the element together with an ion beam such as of argon directly to the intended thin film by means of the ion beam or neutral beam.

For the means of measuring the concentration of sputtered particles, which are directed to the substrate, based on the atomic absorption method in the vicinity to the substrate, an atomic absorption analyzing system is used. Accordingly, the light transmitters and associated light receivers which constitute the detector of this system equal in number of sets to the number of kinds of sputtered particles that make the thin film, are disposed in the space between the targets and the substrate.

The ion beams projected from the ion beam sources to the targets are converged so that about 99% or more of them are projected right on the targets, in order to attain the intended purity of the thin film. This enables the acceleration voltages and currents of the ion beam sources to be correspondent to the amount of sputter of target constituents, whereby the ion beam sputtering method and apparatus with high composition controllability can be achieved.

For the monitoring of the composition ratio of sputtered particles, the scheme of atomic absorption method without the application of electron impingement or the like to sputtered particles is preferable, and through the dynamic control of each ion beam output based on the monitored information so that the intended composition is achieved, film formation which is insusceptible to the aging of target can be accomplished at high repeatability of composition. In addition, the compositions of ion beams or neutral beams for sputtering the targets and the compositions of sputtered particles can be treated as independent film forming conditions.

Through the use of an ion beam source as an assistant ion beam source for projecting a low-energy ion beam or neutral beam of oxygen, nitrogen or the like to the substrate, it becomes possible to control the deficiency of oxide, nitride, etc., or to form a crystalline thin film with anisotropy in the crystal growing direction.

According to the present invention, in which the ion beam output for each target is controlled dynamically while conducting the in-situ monitoring of the composition of sputtered particles so that the composition of thin film can be controlled accurately, it is possible to form a compound thin film at high composition accuracy and high crystal property.

In forming a wiring pattern of laminated thin film structure, the post annealing process can be eliminated, and it is possible to form a strong wiring without incurring a damage to the sharp slope of concentration at the junction.

The inventive method and apparatus of thin film formation, in which the concentration of constituents can be controlled accurately, are suitable for the film formation of multiple-element compounds which necessitate the precise composition control, e.g., multiple-element oxides, multiple-element nitrides, multiple-element metallic compounds, alloys, gradient compounds, gradient alloys, and artificial super lattices.

DESCRIPTION OF THE PREFERRED EMBODIMENTS

Embodiment 1

Figure 1B:
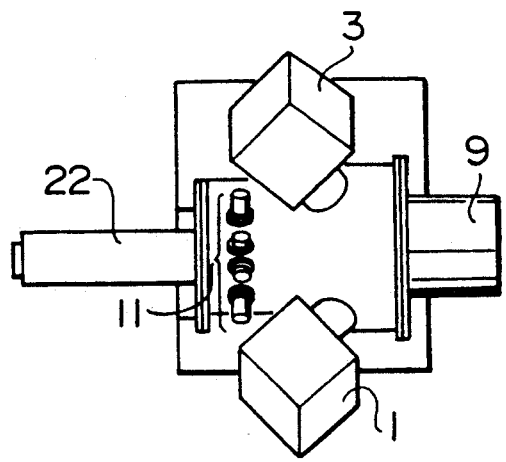
FIG. 1B is a plan view of the apparatus shown in FIG. 1A.
Figure 1A:
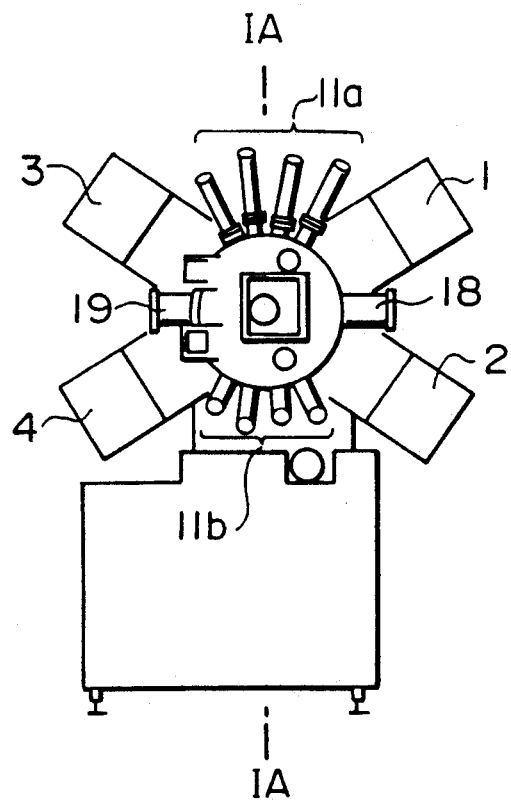
FIG. 1A is a front view of the apparatus which embodies the present invention.
Figure 1C:
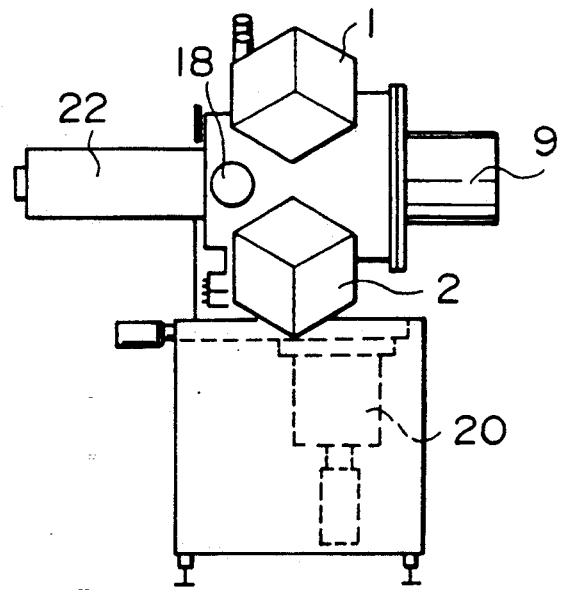
FIG. 1C is a side view of the apparatus shown in FIG. 1A.
Figure 2:
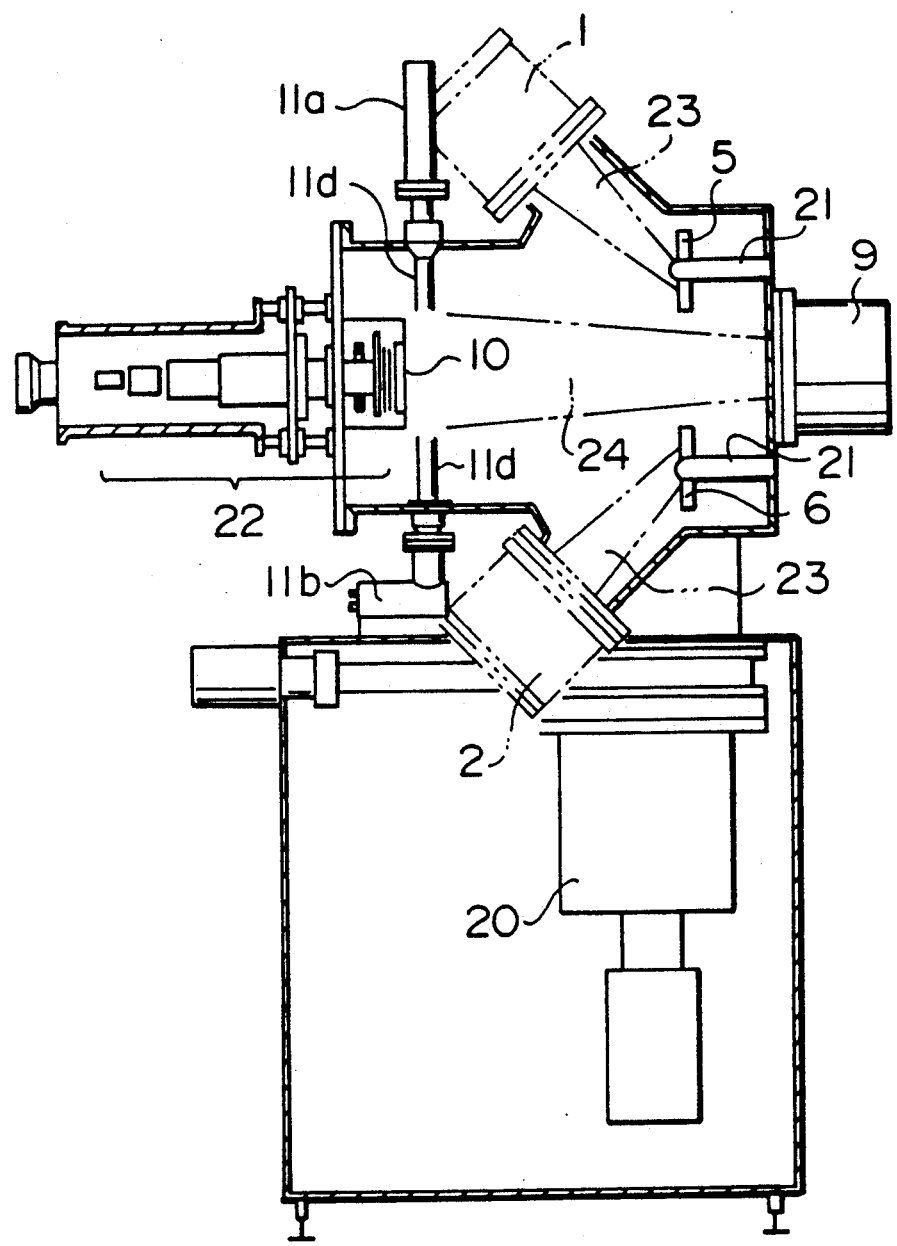
FIG. 2 is a diagram showing the cross-section taken along the line IA—IA of FIG. 1A.
Figure 3:
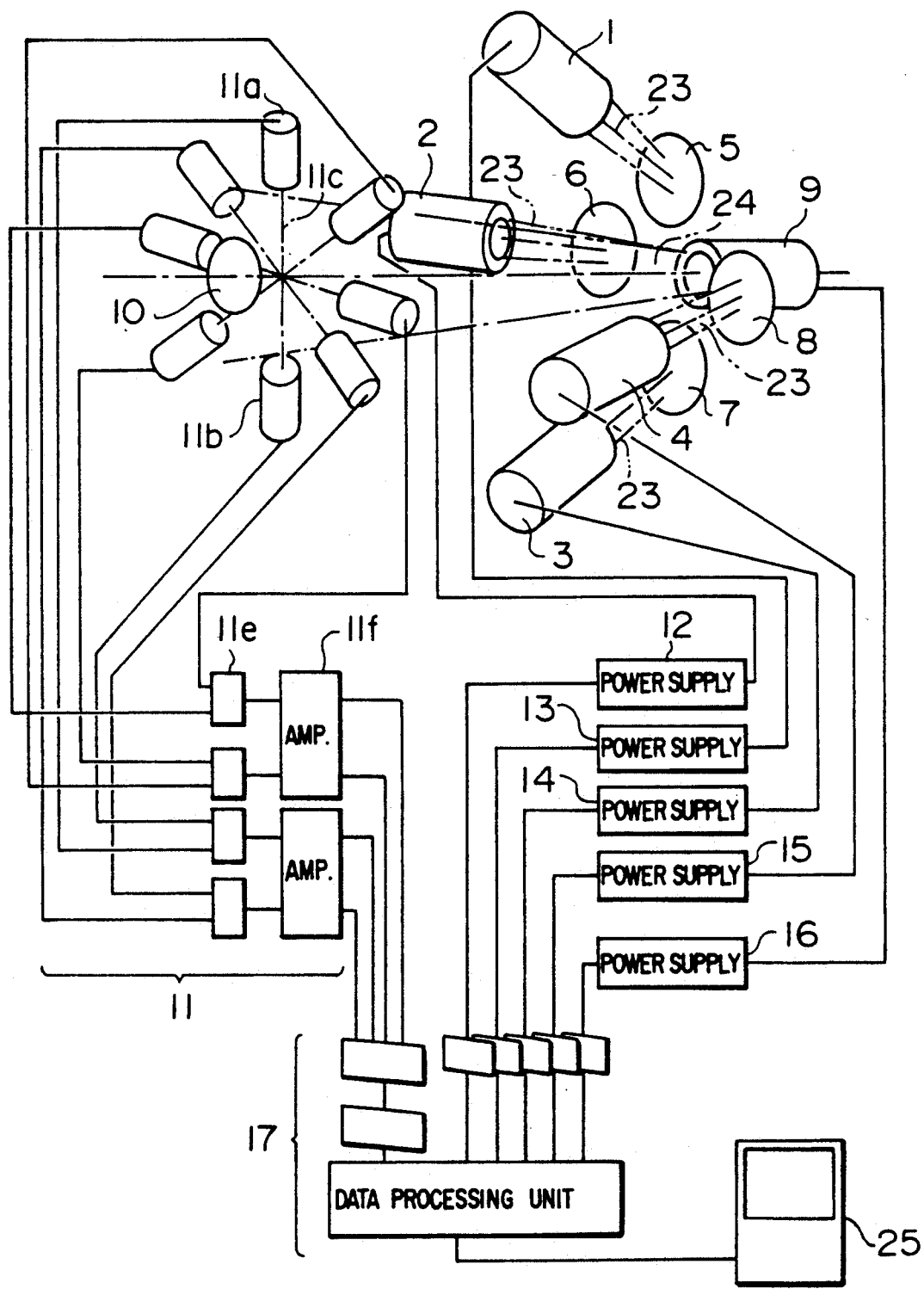
FIG. 3 is a diagram explaining, in a sence of model, the overall apparatus based on the present invention.

This section explains, with reference to FIGS. 1, 2 and 3, an embodiment of the inventive apparatus having four kinds of targets.

Four sets of ion beam or neutral beam sources 1 through 4 for sputtering have corresponding four pieces of target 5 through 8 and an assistant ion beam source 9, as shown in FIGS. 1 and 3. Placed immediately in front of a film formation substrate 10 is an atomic absorption analyzing system 11 as shown in FIGS. 2 and 3, which corresponds to four elements in this embodiment, and the analyzing system enables the monitoring of the composition of sputtered particles during the film formation. The substrate 10 is a monocrystalline MgO substrate, for example.

On the light path 11c of measurement based on the atomic absorption method, there are provided blind tubes 11d attached to the ends of the system's light transmitter 11a and light receiver 11b so that the measurement open light path is confined to the proximity to the substrate thereby to shut out the unwanted stray light. The atomic absorption analyzing system 11 sends the resulting data to a data processing unit 17, as shown in FIG. 3, which implements the computation process and thereafter sends the resulting control data to power supplies 12-15 of the four ion beam sources 1-4 so that the outputs of ion beam sources are controlled in accordance with the prescribed compositions. In this case, the composition measurement based on the atomic absorption method can create error due to the output of the assistant ion beam source 9 and its chemical material, and in such event control data is sent to the power supply 16 of the assistant ion beam source 9 in accordance with to the atomic absorption measurement thereby to adjust the assistant ion beam output.

For the assessment of the created crystal, there is provided a generally-known observation facility for the fast electron beam diffraction (RHEED), which includes a RHEED port 18, an RHEED electron gun 19, a cryopump 20 for the vacuum pumping system, a target manipulator 21 for varying the sputtering beam direction in response to the rotation and inclination of the target, and a substrate heating and turning system 22 for promoting the crystal formation, as shown in FIGS. 1 and 2.

The atomic absorption analyzing system 11 shown in FIG. 3 includes data output ports 11e and amplifiers 11f. The data processing unit 17 has a computation function, which calculates the deviations of concentration of sputtered particles from the predetermined values of composition and sends signals indicative of the detected differences to the power supplies 12-16 so that the ion beam sources are controlled on a feedback basis to produce proper beam outputs. Indicated by 25 is a display unit, on which information in the data processing unit 17, e.g., the preset values of composition, detected concentrations of sputtered particles, and beam correction outputs are displayed on a real time basis.

Although the foregoing apparatus comprises four sets of ion beam sources, four pieces of target corresponding to the beam sources, an atomic absorption analyzing system for four elements, and an assistant ion beam source, the number of these functional components can of course be altered depending on the composition and structure of the thin film to be formed.

Embodiment 2

The following embodiment is to form a film of $Ba_2YCu_3O_{7-\delta}$, which is one of the oxide high-temperature superconductive thin film, by using the ion beam sputtering apparatus based on the foregoing embodiment 1. The ion beam sources and targets were related as follows. Referring back to FIG. 3, the target 5 for the ion beam source 1 was a composite three-element sintered target of Ba-Cu-O for the Ba component, the target 6 for the ion beam source 2 was a $Y_2O_3$ target for the Y component, and the targets 7 and 8 for the ion beam sources 3 and 4 were CuO or Cu targets for the Cu component. The target mount angle was adjusted so that all components were deposited in a uniform distribution on the substrate 10 where the thin film was formed. This adjustment is needed due to different flight angle distributions of sputtered particles discharged from the targets, resulting from differences in the thermal conductivity and beam energy needed for sputtering depending on each target material.

An oxide superconductive thin film is apt to invite oxygen deficiency, and therefore the assistant ion beam or neutral beam source 9 is used to project an oxygen beam having energy up to 200 eV on to the growing thin film surface. Projection of oxygen beam ranging 50–100 eV was most effective, yielding the intended oxide superconductive thin film of the above-mentioned composition. The critical temperature of superconduction of the film immediately after the film formation was 85° K. The temperature of substrate during the film formation was 450° C., and it exhibited superconductivity without the need of a post annealing process. The result of analysis revealed that the proportion of substances other than the superconductive material in the thin film was 1% or less in weight.

Although all ion beam sources used were of the oxygen beam, the use of the argon beam yielded the same result. However, the oxygen beam is preferable in forming an oxide thin film. The ion beam sources were operated at the following acceleration voltages and currents: Ion beam source 1: 1000 V, 100 mA; ion beam source 2: 700 V, 45 mA; ion beam sources 3 and 4: 700 V, 45 mA; assistant ion beam or neutral beam source 9: 100 V, 30 mA.

Embodiment 3

Four pieces of target in the following embodiment were each made of bismuth oxide, copper oxide, sintered mixture of strontium oxide and copper oxide, and sintered mixture of calcium oxide and copper oxide, respectively, and these targets had associated ion beam sources. A thin film of the following compound oxide was formed in the same manner as embodiment 2.

The atomic absorption system has detection systems for elements of bismuth, strontium, calcium and copper. The apparatus was used for the film formation on a monocrystalline magnesium oxide substrate, which was being heated to 400° C. For the assistant ion, oxygen ion beam was used.

Experiment (1) The atomic absorption system was operated to control the composition of thin film to have a proportion of bismuth, 2: strontium, 2: calcium, 2: copper, 3. During the film formation, an oxygen ion beam or oxygen neutral beam was projected.

The resulting thin film satisfied the preset composition formula $Bi_2Sr_2Ca_2Cu_3O_X$ (where $5 \leq X \leq 10$), and the critical temperature of superconduction was 95° K.

Experiment (2) The atomic absorption system was operated to control the composition of thin film to have a proportion of strontium, 2: calcium, 2: copper, 3. Bismuth oxide was sputtered at an interval of 18 Å, so that the overall composition was controlled to have a proportion of bismuth, 2: strontium, 2: calcium, 2: copper, 3. During the film formation, as oxygen ion beam or oxygen neutral beam was projected. The temperature of substrate was 400° C. Crystal formation on the substrate surface was observed based on the fast electron beam diffraction (RHEED) during the film formation. The film formation speed was 1/10 of the case of experiment (1).

The resulting thin film satisfied the preset composition formula $Bi_2Sr_2Ca_2Cu_3O_X$ (where $5 \leq X \leq 10$), which was formed in a periodical fashion to complete a superconductive thin film of composite oxide in multi-layer structure, with composite oxides of different compositions being laminated alternately. The measurement of the superconductive characteristics of this thin film revealed the critical temperature of 100° K.

The observation of the composition distribution of this film based on the transmission electron microscope revealed that the above-mentioned Bi-based layers were formed at an interval of 17–18 Å, and it was concluded that a high-temperature superconductive layer which is stable at low temperature was formed in the film formation.

Although in the embodiments 2 and 3, Y-based $Ba_2YCu_3O_{7-\delta}$ and $Bi_2Sr_2Ca_{n-1}Cu_nO_{2n+2}$ are used as examples, the present invention is also applicable to high-temperature superconductive thin film of other types. Specifically, the invention can be applied to La-based $La_{2X}Ba_XCuO_4$, BPBO-based $(Ba_{1-x}K_x)BiO_3$, T1-based $Tl_2Ba_2Ca_{n-1}Cu_nO_{2n+2}$, Pb-based $Pb_2Sr_2ACu_3O$, Nb-based $Nb_{2X}Ce_XCuO_{4Y}$, and $CaSr_2(Cu, Bi)_3O$, for example.

Embodiment 4

The following embodiment is to form a strong aluminum wiring on a monocrystalline silicon substrate by ion beam sputtering in the same manner as the embodiments 2 and 3 using the apparatus of the embodiment 1. Targets were each made of metallic titanium, aluminum, silicon and gold.

Initially, a film of titanium is formed for about 50 Å on a silicon substrate, and thereafter nitrogen gas is introduced gradually from the assistant ion beam source 9 so that a compositional slope from titanium layer to titanium nitride layer is formed continuously.

The output of the ion beam source which sputters the aluminum target is raised gradually so that an intermediate layer made of titanium, aluminum and nitrogen is formed.

After that, the output of the ion beam source which sputters the titanium target is lowered gradually so that an insulation aluminum nitride layer is formed.

The nitrogen gas assistant beam is halted so that a pure aluminum layer is formed by argon gas, sputtering.

For the protection of wire bonding, a thin film of gold is formed on the aluminum surface through the similar ion beam sputtering.

Through the above processes, aluminum wiring having a strength of adhesion of 1000 g-weight/mm was formed.

In the conventional film forming method, the discontinuity of composition emerges at the interface of laminated thin films of different compositions, which apts to develop a peel-off. To cope with this problem, a post annealing process is conducted so that the diffusion takes place at each interface. In contrast, the inventive method can readily form a continuous slope of composition, and high strength of adhesion can be achieved without the need of such post annealing process. Consequently, a strong aluminum wiring can be formed without incurring a damage to the junction interface having a sharp concentration profile.

We claim:

1. A method of forming a multiple-element thin film based on ion beam sputtering comprising:
   a step of producing ion beams or neutral beams which are neutralized ion beams with a plurality of ion beam sources;
   a step of projecting said ion beams or neutral beams to a plurality of targets for sputtering so that said targets discharge sputtered particles;
   a step of projecting said sputterd particles onto a substrate;
   a step of measuring a ratio of composition of said sputtered particles, which pass by the surface of said substrate, based on the atomic absorption method;
   a step of comparing the measured composition ratio of sputtered particles with a predetermined reference composition ratio of sputtered particles and controlling said ion beam sources so that the measured composition ratio of sputtered particles is adjusted to coincide with the predetermined reference composition ratio; and
   a step of depositing the sputtered particles, with the measured composition ratio thereof being adjusted, on said substrate thereby to form a thin film.

2. A method of forming a multiple-element thin film based on ion beam sputtering in which ion beams drawn out of a plurality of ion beams sources or neutral beams that are neutralized ion beams are projected to a plurality of targets for sputtering which are provided in correspondence to said ion beam sources and sputtered particles discharged from said targets are deposited on a substrate so that a multiple-element thin film is formed on said substrate, wherein a ratio of composition of sputtered particles which pass by the surface of said substrate is measured based on the atomic absorption method, the result of measurement is compared with a predetermined reference composition ratio of sputtered particles thereby to detect the deviation of composition ratio, output data is computed based on the result of detection so as to achieve the predetermined reference composition ratio of sputtered particles, and power supplied of said ion beam sources are controlled based on the result of computation so that the acceleration voltage and ion current density of said ion beam sources are adjusted, the ratio of composition of sputtered particles which are deposited on said substrate being monitored directly during the film formation.

3. A method of forming a multiple-element thin film based on ion beam sputtering according to claim 2, wherein said targets are made of at least one of metal, metallic oxide and metallic nitride, further comprising an assistant ion beam source of a beam of at least one of oxygen and nitrogen, and a composite metallic compound thin film formed of at least one of composite metallic oxide and composite metallic nitride is formed on said substrate.

4. A method of forming a multiple-element thin film based on ion beam sputtering according to claim 2, wherein said targets are made of at least a metal or alloy, said ion beam sources are formed of ion beams of a rare gaseous element, and a thin film of at least one of alloy and metallic compound is formed on said substrate.

5. A method of forming a multiple-element thin film based on ion beam sputtering according to claim 2, wherein said targets are made of at least one of metal, metallic oxide and metallic nitride, further comprising an assistant ion beam source of a beam of at least one of oxygen and nitrogen, and a multi-element film wiring structure formed of at least one of metallic oxide or metallic nitride is formed on said substrate.

6. A multiple-element ion beam sputtering apparatus comprising:
   a substrate;
   a plurality of targets which are used as a source material for forming a thin film on said substrate;
   a plurality of ion beams sources or neutral beam sources which are provided in correspondence to said targets and operated by being controlled independently of each other to project beams to said targets so that said targets discharge sputtered particles;
   means for projecting said sputtered particles onto said substrate so that a thin film is formed on said substrate;
   means for measuring a composition ratio of sputtered particles in the vicinity to the surface of said substrate based on the atomic absorption method;
   means for comparing the measured composition ratio of sputtered particles measured by said measuring means with a predetermined reference composition ratio of sputtered particles and controlling said ion beam sources or neutral beam sources based on the result of measurement so that the measured composition ratio of sputtered particles coincides with the predetermined reference composition ratio.

7. A multiple-element thin film forming apparatus based on ion beam sputtering comprising:
   a plurality of ion beam sources or neutral beam sources which can be controlled independently;
   a plurality of targets which are provided in correspondence to said beam sources and used as evaporation sources of the thin film constituents;
   means for projecting said beams to said targets so that sputtered particles discharged from said targets are deposited on a substrate;
   means for measuring a concentration of sputtered particles, which are discharged from said targets and directed to said substrate, in correspondence to said substrate on the basis of the atomic absorption method; means for comparing the result of measurement with a predetermined reference composition ratio of sputtered particles thereby to detect a deviation therebetween and for computing output data based on the result of detection so as to achieve the predetermined reference composition ratio of sputtered particles; and
   means for controlling said ion beam sources or neutral beam sources based on the result of computation thereby to adjust an acceleration voltage and current density of the beams so that the measured concentration of sputtered particles is controlled, the measured concentration of sputtered particles which are deposited on said substrate being monitored directly during the film formation.

8. A multiple-element thin film forming apparatus based on ion beam sputtering according to claim 7, further comprising, an assistant ion beam source which projects a beam directly to said substrate.

9. A multiple-element thin film forming apparatus based on ion beam sputtering according to claim 7, wherein the means for measuring the concentration of sputtered particles measures a composition ratio of sputtered particles, the means for comparing compares the measured composition ratio with the predetermined reference composition ratio, and the means for controlling adjusts the acceleration voltage and current density in accordance with the detected deviation therebetween.

* * * * *